US008487794B2

(12) United States Patent
Huang et al.

(10) Patent No.: US 8,487,794 B2
(45) Date of Patent: Jul. 16, 2013

(54) SUCCESSIVE APPROXIMATION REGISTER ADC AND METHOD OF LINEARITY CALIBRATION THEREIN

(75) Inventors: Xuan-Lun Huang, Changhua County (TW); Jiun-Lang Huang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 44 days.

(21) Appl. No.: 13/343,725

(22) Filed: Jan. 5, 2012

(65) Prior Publication Data

US 2013/0127647 A1 May 23, 2013

(30) Foreign Application Priority Data

Nov. 23, 2011 (TW) ................................ 100142894

(51) Int. Cl.
*H03M 1/10* (2006.01)
(52) U.S. Cl.
USPC ............................. 341/120; 341/155; 341/172
(58) Field of Classification Search
USPC .................. 341/117, 118, 119, 120, 155, 172
See application file for complete search history.

(56) References Cited

U.S. PATENT DOCUMENTS

| 4,999,633 | A * | 3/1991 | Draxelmayr ................... 341/120 |
|---|---|---|---|
| 5,579,005 | A | 11/1996 | Moroni |
| 6,400,302 | B1 * | 6/2002 | Amazeen et al. ............. 341/172 |
| 6,882,298 | B2 | 4/2005 | Leung et al. |
| 7,170,439 | B1 * | 1/2007 | Chen .............................. 341/172 |
| 7,199,746 | B1 * | 4/2007 | Chowdhury et al. ......... 341/172 |
| 7,408,490 | B2 | 8/2008 | Melanson et al. |
| 7,605,741 | B2 | 10/2009 | Hurrell |
| 7,786,908 | B2 | 8/2010 | Yoshinaga |
| 7,839,319 | B2 | 11/2010 | Nittala et al. |
| 7,944,379 | B2 | 5/2011 | Ohnhaeuser et al. |
| 2004/0227652 | A1 * | 11/2004 | Draxelmayr ................... 341/120 |
| 2011/0122006 | A1 | 5/2011 | Liao et al. |

FOREIGN PATENT DOCUMENTS

TW   I240800   10/2005

OTHER PUBLICATIONS

Liu et al., "A 600MS/s 30mW 0.13μm CMOS ADC Array Achieving Over 60dB SFDR with Adaptive Digital Equalization", 2009 IEEE International Solid-State Circuits Conference, Feb. 9, 2009, pp. 82-83.
Liu et al., "A 12b 22.5/45MS/s 3.0mW 0.059mm2 CMOS SAR ADC Achieving Over 90dB SFDR", 2010 IEEE International Solid-State Circuits Conference, ISSCC 2010 / Feb. 10, 2010, pp. 380-381.

(Continued)

*Primary Examiner* — Jean B Jeanglaude
(74) *Attorney, Agent, or Firm* — Jianq Chyun IP Office

(57) ABSTRACT

A successive approximation register analog to digital converter (SAR ADC) and a method of linearity calibration therein are provided. Each composed element $E_i$ in a part of the composed elements includes a main constructed element $E_i^0$ and $w_i$ sub constructed element $E_i^1, E_i^2, \ldots, E_i^{w_i}$. The SAR ADC selects a part of the sub constructed elements $E_i^1, E_i^2, \ldots, E_i^{w_i}$ and make them non-functional when a missing decision level is caused by the composed element $E_i$. An overlap cancellation to the obtained missing code numbers is performed, compensation coefficients are updated according to the missing code numbers after the overlap cancellation, and a compensation to the corresponding digital value is performed according to the compensation coefficients. The present disclosure prevents the necessity of matching each composed element of the DAC in the SAR ADC.

34 Claims, 10 Drawing Sheets

OTHER PUBLICATIONS

Giannini et al., "An 820µW 9b 40MS/s Noise-Tolerant Dynamic-SAR ADC in 90nm Digital CMOS", 2008 IEEE International Solid-State Circuits Conference, ISSCC 2008 / Feb. 5, 2008, pp. 238-239.

Cho et al., "A 9-bit 80 MS/s Successive Approximation Register Analog-to-Digital Converter With a Capacitor Reduction Technique", IEEE Transactions on Circuits and Systems-II: Express Briefs, vol. 57, No. 7, Jul. 2010, pp. 502-506.

Wong et al., "Parasitic Calibration by Two-Step Ratio Approaching Techinque for Split Capacitor Array SAR ADCs", SoC Design Conference (ISOCC), 2009 International, Nov. 22-24, 2009, pp. 333-336.

\* cited by examiner

SUCCESSIVE APPROXIMATION REGISTER ADC AND METHOD OF LINEARITY CALIBRATION THEREIN

CROSS-REFERENCE TO RELATED APPLICATION

This application claims the priority benefit of Taiwan application serial no. 100142894, filed on Nov. 23, 2011. The entirety of the above-mentioned patent application is hereby incorporated by reference herein and made a part of this specification.

BACKGROUND OF THE INVENTION

1. Technical Field

The technical field relates to an analog-to-digital converter (ADC), and more particularly to a successive approximation register analog-to-digital converter (SAR ADC) and a method of linearity calibration therein.

2. Related Art

In recent years, integrated circuit design has been trending towards increasingly difficult demands on lowering power consumption and cost along with enhancing performance. In the design of front-end analog circuits, an efficient analog-to-digital converter (ADC) can drastically enhance the overall system performance. The ADC is responsible for converting the received analog signals into digital signals, and providing the digital signals for the operation of the back-end digital signal processing unit. Therefore, characteristics of the ADC such as its dynamic range, resolution, accuracy, linearity, sampling speed, power consumption, and its input stage are crucial factors which influence the overall system performance, and these characteristics serve as several parameters for evaluating the performance of the ADC.

For two categories in resolution and sampling speed, the application range of an ADC with 8-14 bits and one to several hundred mega samples per second (MSPS) is quite broad. Applications such as in the front-end of the base frequency or the intermediate frequency of a communication system, a biomedical imaging process such as the front-end of a ultrasonic imaging system, and the front-end of a laser array system are all within the range of applications. The ADC has many types of configurations, and when manufacturing an ADC matching the aforementioned specifications, a diverse array of configurations can be chosen. The mainstream ADC applied commercially is the pipeline analog-to-digital converter, or the pipeline ADC. However, in recent years, articles in prominent international journals have gravitated towards the successive approximation register analog-to-digital converter (SAR ADC) as a popular research direction, because the SAR ADC configuration almost does not require a direct current bias voltage. Since the SAR ADC requires a good amount of digital circuits for control and signal processing, when the manufacturing process enters the deep sub-micron, the chip area and the power consumption needed for a portion of the digital circuits can be effectively reduced. Accordingly, the SAR ADC is suitable for developing the intellectual property from a large scale system-on-chip (SoC). In many disclosures, the SAR ADC has lower consumption and smaller chip area when compared to the pipeline ADC with the same specification requirements. Therefore, the technical development of the SAR ADC framework has become an active field of research.

However, a major functional block exists in the SAR ADC configuration: the digital-to-analog converter (DAC), which directly influences the performance of the SAR ADC. Due to the strong necessity of matching among each of the composed elements in the DAC, such as the capacitor, the DAC takes up a significant portion of the overall chip area and the power consumption of the SAR ADC. Thus, when the DAC requires a larger area, the driving circuit of the DAC also requires a larger driving force, and this further increases the area and power consumption. Since the cost of digital circuits is low, if the matching requirement the DAC places on each of the composed elements can be reduced or eliminated by adopting processing techniques using digital circuits, the overall chip area and power consumption of the ADC can be lowered.

FIG. 1 is a simplified circuit diagram of a SAR ADC. Please refer to FIG. 1. A SAR ADC 10 includes a DAC 12, a comparator 16, and a successive approximation register logic (SAR logic) circuit 18. The DAC 12 includes a plurality of switches $S_0$, $S_1$, $S_2$, $S_3$, $S_r$, $S_i$, and $S_g$ and four composed capacitors $C_0$, $C_1$, $C_2$, and $C_3$, and all of the first terminals of the composed capacitors are coupled to a same node X. A first terminal of a reference capacitor $C_r$ is also coupled to the afore-described node X. During a sampling mode, the switches $S_0$, $S_1$, $S_2$, $S_3$, and $S_r$ are switched to conduct to the switch $S_i$, and the switch $S_i$ is switched to conduct to an input voltage $V_{in}$. The switch $S_g$ is conducted so the capacitors $C_0$, $C_1$, $C_2$, $C_3$, and $C_r$ are charged to the input voltage $V_{in}$. Thereafter, the switch $S_g$ is broken off and non-conductive, and the switches $S_0$, $S_i$, $S_2$, $S_3$, and $S_r$ are switched to conduct to the ground voltage level, so the voltage at the node X becomes $-V_{in}$. During a conversion mode, the switch $S_i$ is switched to conduct to the reference voltage $V_{ref}$, the switch $S_g$ is broken off, and the switches $S_0$, $S_1$, $S_2$, and $S_3$ are switched according to a 4-bit control signal. After the successive approximation, when the voltage at the afore-described node X approaches 0, that is, when the equivalent open circuit outputs of the two modes are approximately equal, the final ADC digital output value can be calculated and obtained according to the 4-bit control signal.

The capacitors of the DAC depicted in FIG. 1 have a capacitance of radix 2, that is:

$$C = 2^n * C_r$$

in which n is a positive integer greater than or equal to 0 and less than 4. Therefore, after the successive approximation, the SAR logic circuit 18 transmits a 4-bit control signal to the DAC 12, that is the last ADC digital output value $ADC_{OUT}$, in which all of the bit values $D_0$, $D_1$, $D_2$, and $D_3$ of the control signal equals 0 or 1. However, the linearity of the ADC is directly affected by the difference between the actual value and the ideal value of the capacitor.

SUMMARY OF THE INVENTION

According to an exemplary embodiment, a method of linearity calibration for a successive approximation register analog-to-digital converter (SAR ADC) is provided. The SAR ADC includes a digital-to-analog converter (DAC), and the DAC includes a reference element $E_r$ and N composed elements $E_0$, $E_1$, ..., $E_{N-1}$. Each composed element $E_i$ in a part of the composed elements includes a main constructed element $E_i^0$ and $w_i$ sub constructed elements $E_i^1$, $E_i^2$, ..., $E_i^{w_i}$, in which N is a positive integer greater than 1, $w_i$ is a positive integer greater than or equal to 1, i is a positive integer greater than or equal to 0 and less than N. The method of linearity calibration includes the following steps. In one step, a less significant bit (LSB) y for calibration is selected in order to calibrate the composed elements $E_y$, $E_{y+1}$, $E_{N-1}$, in which y is a positive integer greater than or equal to 0 and less than N. In another step, the following step is repeated starting from i equals to y, increasing i successively by 1, until all of the composed elements for calibration have been calibrated. In one step, whether a missing decision level is caused by the composed element $E_i$ is identified, and a part of the sub constructed elements $E_i^1, E_i^2, \ldots, E_i^{w_i}$ is selected and made non-functional when the missing decision level is caused by the composed element $E_i$.

According to an exemplary embodiment, a SAR ADC is provided, including a DAC, a comparator, a SAR logic circuit, a weighting adjustment register, and a calibration logic circuit. The DAC includes a reference element $E_r$ and N composed elements $E_0, E_1, \ldots, E_{N-1}$. Each composed element $E_i$ in a part of the composed elements includes a main constructed element $E_i^0$ and $w_i$ sub constructed elements $E_i^1, E_i^2, \ldots, E_i^{w_i}$, in which N is a positive integer greater than 1, $w_i$ is a positive integer greater than or equal to 1, and i is a positive integer greater than or equal to 0 and less than N. The comparator has a first input terminal, a second input terminal, and an output terminal, and the comparator is adapted for comparing the inputs of the first input terminal and the second input terminal, and outputting a comparison result at the output terminal. The SAR logic circuit is coupled to the comparator and the DAC, and the SAR logic circuit is adapted for selecting one of a first value $V_1$ and a second value $V_0$ as the input values of all of the composed elements $E_0, E_1, \ldots, E_{N-1}$ according to an output of the comparator, so as to obtain a corresponding digital value of an input voltage. The weighting adjustment register is coupled to the DAC and is adapted for storing the missing decision level calibration information. The SAR ADC makes a part of the sub constructed elements $E_i^1, E_i^2, \ldots, E_i^{w_i}$ non-functional according to the missing decision level calibration information. The calibration logic circuit is coupled to the SAR logic circuit and the weighting adjustment register, and the calibration logic circuit controls the SAR logic circuit to select one of the first value $V_1$ and the second value $V_0$ as the input values of all of the composed elements $E_0, E_1, \ldots, E_{N-1}$ and the reference element $E_r$. According to the output of the comparator, the calibration logic circuit adjusts the missing decision level calibration information.

According to an exemplary embodiment, another method of linearity calibration for a SAR ADC is provided. The SAR ADC includes a DAC, and the DAC includes a reference element $E_r$ and N composed elements $E_0, E_1, \ldots, E_{N-1}$. The method of linearity calibration includes the following steps. In one step, the missing codes caused by each composed element $E_i$ in a part of the composed elements are identified to obtain a missing code number $m_i$. In another step, an overlap cancellation to all of the obtained missing code numbers is performed. In one step, a plurality of compensation coefficients are updated according to all of the missing code numbers after the overlap cancellation. The compensation coefficients include a compensation coefficient $\epsilon_1$ corresponding to each composed element $E_i$. In another step, a compensation to a corresponding digital value outputted by a SAR logic circuit is performed according to the compensation coefficients. N is a positive integer greater than 1, and i is a positive integer greater than or equal to 0 and less than N.

According to an exemplary embodiment, another SAR ADC is provided, including a DAC, a comparator, a SAR logic circuit, a compensation coefficient register, a calibration logic circuit, and a compensation logic circuit. The DAC includes a reference element $E_r$ and N composed elements $E_0, E_1, \ldots, E_{N-1}$. The comparator has a first input terminal, a second input terminal, and an output terminal, and the comparator is adapted for comparing the inputs of the first input terminal and the second input terminal, and outputting a comparison result at the output terminal. The SAR logic circuit is coupled to the comparator and the DAC, and the SAR logic circuit is adapted for selecting one of a first value $V_1$ and a second value $V_0$ as the input values of all of the composed elements $E_0, E_1, \ldots, E_{N-1}$ according to an output of the comparator, so as to obtain a corresponding digital value of an input voltage. The compensation coefficient register is adapted for storing a plurality of compensation coefficients. The calibration logic circuit is coupled to the SAR logic circuit and the compensation coefficient register. The calibration logic circuit controls the SAR logic circuit to select one of the first value $V_1$ and the second value $V_0$ as the input values of all of the composed elements $E_0, E_1, \ldots, E_{N-1}$ and the reference element $E_r$. According to the output of the comparator, the calibration logic circuit adjusts the compensation coefficients. The compensation logic circuit is coupled to the SAR logic circuit and the compensation coefficient register. The compensation logic circuit is adapted for performing a compensation to the corresponding digital value outputted by the SAR logic circuit according to the compensation coefficients. When the SAR ARC performs a linearity calibration: the missing codes caused by each composed element $E_i$ in a part of the composed elements are identified to obtain a missing code number $m_i$, an overlap cancellation is performed to all of the obtained missing code numbers $m_i$, and the compensation coefficients are updated according to all of the missing code number after the overlap cancellation. The compensation coefficients include a compensation coefficient $\epsilon_i$ corresponding to each composed element $E_i$. N is a positive integer greater than 1, and i is a positive integer greater than or equal to 0 and less than N.

Several exemplary embodiments accompanied with figures are described in detail below to further describe the disclosure in details.

BRIEF DESCRIPTION OF THE DRAWINGS

The accompanying drawings constituting a part of this specification are incorporated herein to provide a further understanding of the disclosure. Here, the drawings illustrate embodiments of the disclosure and, together with the description, serve to explain the principles of the disclosure.

DESCRIPTION OF EMBODIMENTS

Figure 1:
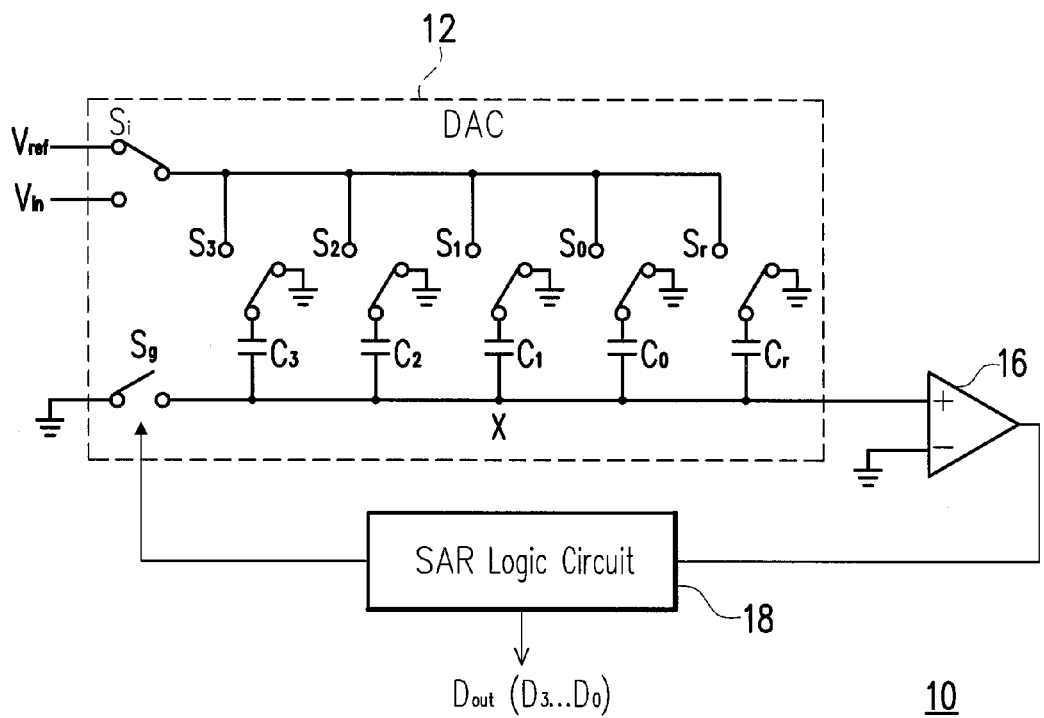
FIG. 1 is a simplified circuit diagram of a SAR ADC.
Figure 2:
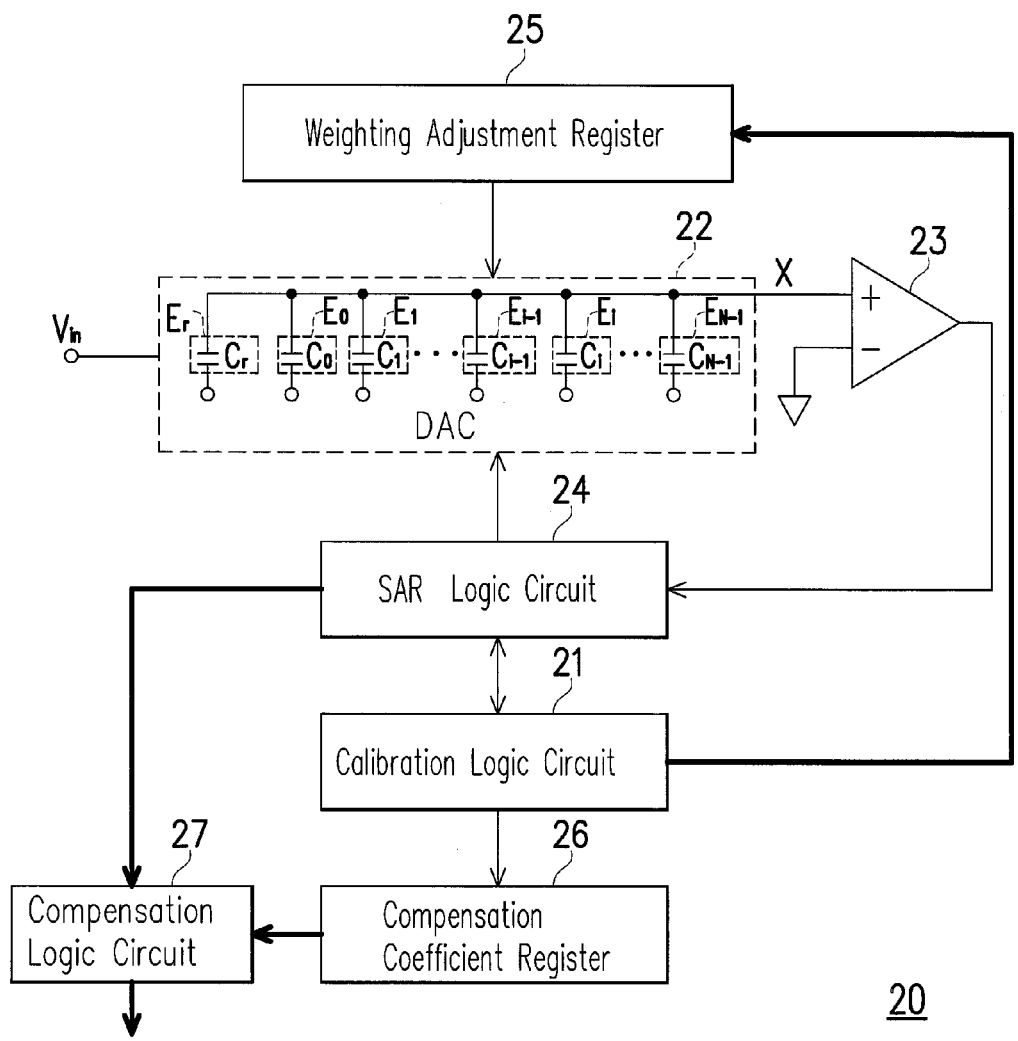
FIG. 2 is a block diagram of a SAR ADC according to an exemplary embodiment.
Figure 3:
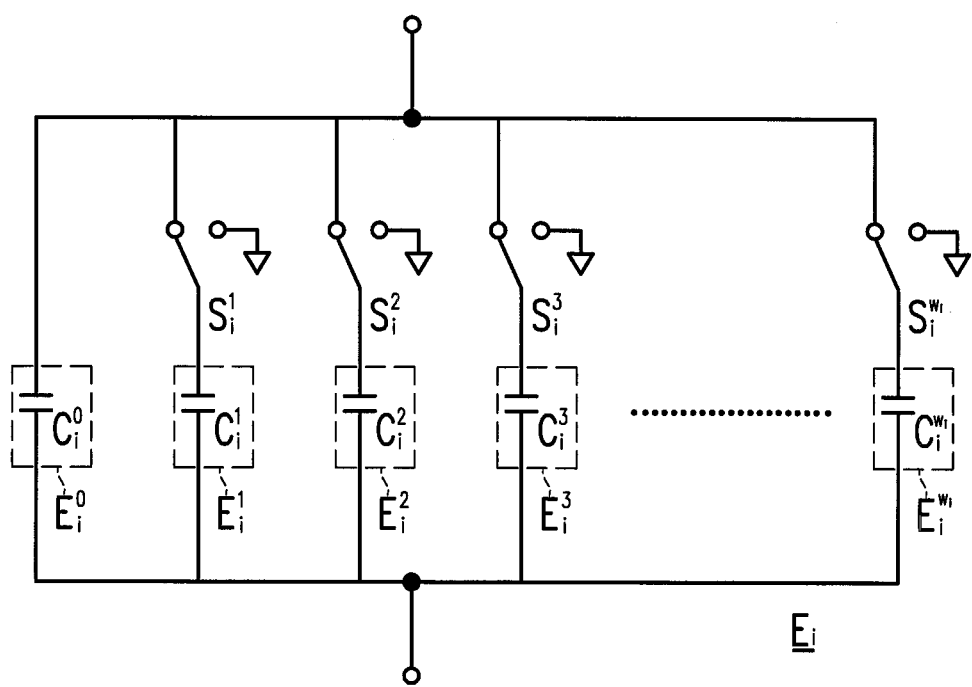
FIG. 3 is a circuit block diagram of the composed elements $E_i$ in a DAC according to an exemplary embodiment.

A SAR ADC is disclosed. As shown in FIG. 2, a block diagram of a SAR ADC according to an exemplary embodiment is illustrated in FIG. 2. Please refer to FIG. 2. A SAR ADC 20 includes a calibration logic circuit 21, a DAC 42, a comparator 23, a SAR logic circuit 24, a weighting adjustment register 25, a compensation coefficient register 26, and a compensation logic circuit 27. The DAC 22 includes a reference element $E_r$ and N composed elements $E_0, E_1, \ldots, E_{N-1}$. A composed element in a DAC is disclosed. As shown in FIG. 3, FIG. 3 is a circuit block diagram of the composed elements $E_i$ in a DAC according to an exemplary embodiment. Please refer to both FIGS. 2 and 3. Each composed element $E_i$ in a part of the afore-described composed elements $E_0, E_1, \ldots, E_{N-1}$ includes a main constructed element $E_i^0$, $w_i$ switches $S_i^1, S_i^2, \ldots,$ and $S_i^{w_i}$, and $w_i$ sub constructed elements $E_i^1, E_i^2, \ldots, E_i^{w_i}$. The switches $S_i^1, S_i^2, \ldots, S_i^{w_i}$ are coupled to the sub constructed elements $E_i^1, E_i^2, \ldots, E_i^{w_i}$, N is a positive integer greater than 1, $w_i$ is a positive integer greater than or equal to 1, and i is a positive integer greater than or equal to 0 and less than N. For clarity of description, a plurality of switches in the DAC 22 depicted in FIG. 2 are not drawn so as to avoid cluttering. The coupling and operation of the switches can be referenced to FIG. 6A, 6B, or 7, although the disclosure is not limited thereto.

For example, for a 12-bit SAR ADC where N=12, the DAC in the SAR ADC includes a reference element $E_r$ and 12 composed elements $E_0, E_1, \ldots, E_{11}$. A part of the composed elements may include the last 8 composed elements $E_4, E_5, \ldots, E_{11}$, the last 6 composed elements $E_6, E_7, \ldots, E_{11}$, all of the composed elements, or other combinations, and the disclosure is not limited thereto. The composed element $E_{11}$ in the composed elements may include the main constructed element $E_{11}^0$ and $w_{11}=8$ sub constructed elements $E_{11}^1, E_{11}^2, \ldots, E_{11}^8$, the composed element $E_6$ may include the main constructed element $E_6^0$ and $w_6=4$ sub constructed elements $E_6^1, E_6^2, E_6^3,$ and $E_6^4$, or other combinations, and the disclosure is not limited thereto. Each of the afore-described elements has a corresponding weighting value. For example, $W_r$ is the weighting value of the reference element $E_r$, $W_i$ is the weighting value of the composed element $E_i$, etc.

In the present embodiment, the composed elements and the reference element are capacitors, for example. Therefore, the reference element $E_r$ is a reference capacitor $C_r$ having a first terminal and a second terminal, and the composed elements are N composed capacitors represented by $C_0, C_1, \ldots, C_{N-1}$. Each of the composed capacitors has a first terminal and a second terminal, and all of the first terminals of the composed capacitors are coupled to a same node X. The first terminal of the reference capacitor $C_r$ is coupled to the afore-described node X, and the weighting values of all the elements may be understood in this example as capacitances. Each of the composed capacitors in a part of the afore-described composed capacitors $C_0, C_1, \ldots, C_{N-1}$ includes a main constructed capacitor $C_i^0$ and $w_i$ sub constructed capacitors $C_i^1, C_i^2, \ldots, C_i^{w_i}$.

The present embodiment uses capacitors merely as an example, but the disclosure is not limited thereto. The composed elements and the reference element may be one of capacitors, resistors, and current sources, or other components which can be assembled into a DAC. When the composed elements are not capacitors, depending on the structure of the DAC, the circuits of the composed elements and the reference element do not necessarily have to have the first terminals connected together as depicted in the figure.

Please continue reference to FIG. 2. The comparator 23 has a first input terminal, a second input terminal, and an output terminal. The comparator 23 is adapted for comparing the inputs of the first input terminal and the second input terminal, and outputting a comparison result at the output terminal. The SAR logic circuit 24 is coupled to the comparator 23 and the DAC 22, and the SAR logic circuit 24 is adapted for selecting one of a first value $V_1$ and a second value $V_0$ as the input values of all of the composed elements $E_0, E_1, \ldots, E_{N-1}$ according to an output of the comparator 23, so as to obtain a corresponding digital value of the input voltage $V_{in}$. In the present embodiment, since the composed elements are the composed capacitors, the first value $V_1$ and the second value $V_0$ may respectively be a voltage value VRT and a voltage value VRB, or a voltage value Vref and 0, although the disclosure is not limited thereto. If the composed elements are current sources, then the first value $V_1$ and the second value $V_0$ may be control signals representing 1 and 0.

The weighting adjustment register 25 is coupled to the DAC 22, and the weighting adjustment register 25 is adapted for storing the missing decision level calibration information. The SAR ADC 20 makes a part of the sub constructed elements $E_i^1, E_i^2, \ldots, E_i^{w_i}$ non-functional according to the missing decision level calibration information. The calibration logic circuit 21 is coupled to the SAR logic circuit 24 and the weighting adjustment register 25. The calibration logic circuit 21 controls the SAR logic circuit 24 to select one of the first value $V_1$ and the second value $V_0$ as the input values of all of the composed elements $E_0, E_1, \ldots, E_{N-1}$ and the reference element $E_r$. Moreover, according to the output of the comparator 23, the calibration logic circuit 21 adjusts the missing decision level calibration information in order to make a part of the sub constructed elements $E_i^1, E_i^2, \ldots, E_i^{w_i}$ non-functional. In other words, the actual weighting value of the composed element $E_i$ is adjusted to achieve linearity calibration. Detailed description of the steps in the linearity calibration is provided later in the disclosure.

Please continue reference to FIG. 2. The compensation coefficient register 26 is adapted for storing a plurality of compensation coefficients. The calibration logic circuit 21 is coupled to the compensation coefficient register 26. The calibration logic circuit 21 controls the SAR logic circuit 24 to select one of the first value $V_1$ and the second value $V_0$ as the input values of all of the composed elements $E_0, E_1, \ldots, E_{N-1}$ and the reference element $E_r$. Moreover, according to the output of the comparator 23, the calibration logic circuit 21 adjusts the compensation coefficient. The compensation logic circuit 27 is coupled to the SAR logic circuit 24 and the compensation coefficient register 26. According to the compensation coefficient, the compensation logic circuit 27 compensates the corresponding digital value outputted by the SAR logic circuit 24, so as to achieve linearity compensation. Detailed description of the steps in the linearity calibration is provided later in the disclosure.

Figure 4:
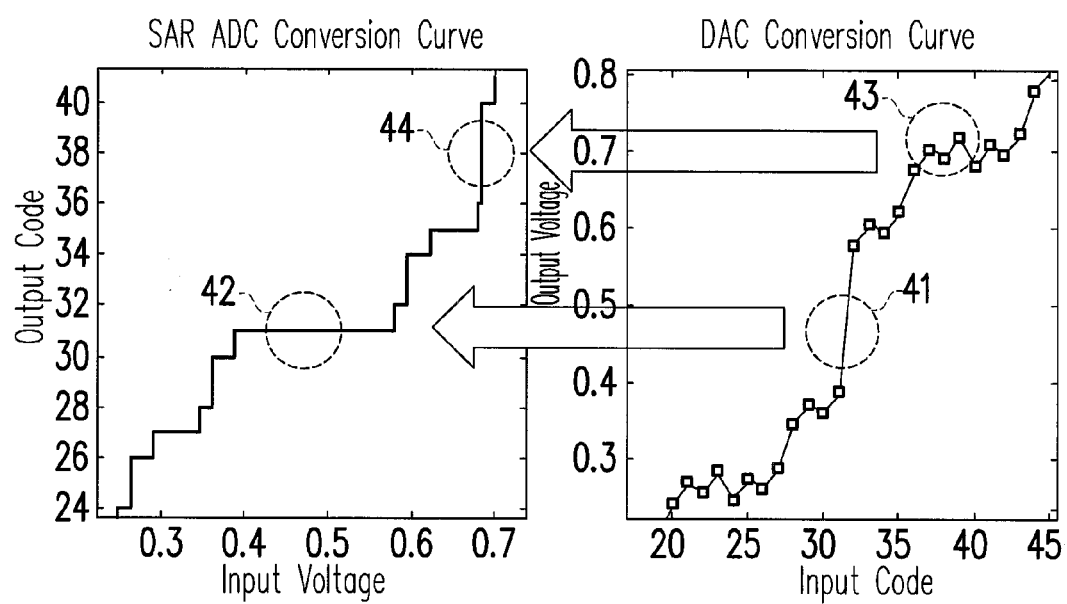
FIG. 4 is a conversion curve diagram of a SAR ADC and a DAC therein according to an exemplary embodiment.

FIG. 4 is a conversion curve diagram of a SAR ADC and a DAC therein according to an exemplary embodiment. Please refer to FIG. 4. Since the DAC in the SAR ARC strongly requires matching among the composed elements, therefore, when the weighting values for each of the composed elements do not match, the code width outputted by the ADC is affected. Taking each element as a capacitor for example, when the capacitances of the composed capacitors $C_i$ satisfy the following formula:

$$C_i > \sum_{j=0}^{i-1} C_j + C_r, \quad (1)$$

and bit i of an input code in the DAC changes from 0 to 1, as shown by the circular line 41 in FIG. 4, the output voltage of the DAC has a large upward jump compared to the other normal values. Consequently, on the output curve of the SAR ADC, a plurality of different input voltages may have no correspondingly different digital output values, or these input voltages may have the same digital output value, as shown by the circular line 42. This condition is referred to as missing decision level. When the capacitances of the composed capacitors $C_i$ satisfy the following formula:

$$C_i < \sum_{j=0}^{i-1} C_j, \quad (2)$$

and bit i of the input code in the DAC changes from 0 to 1, as shown by the circular line 43 in FIG. 4, the output voltage of the DAC does not rise but falls. Consequently, on the output curve of the SAR ADC, two adjacent input voltages correspond to two digital output values of extremely large numerical difference, as shown by the circular line 44. This condition is referred to as missing code.

Figure 5:
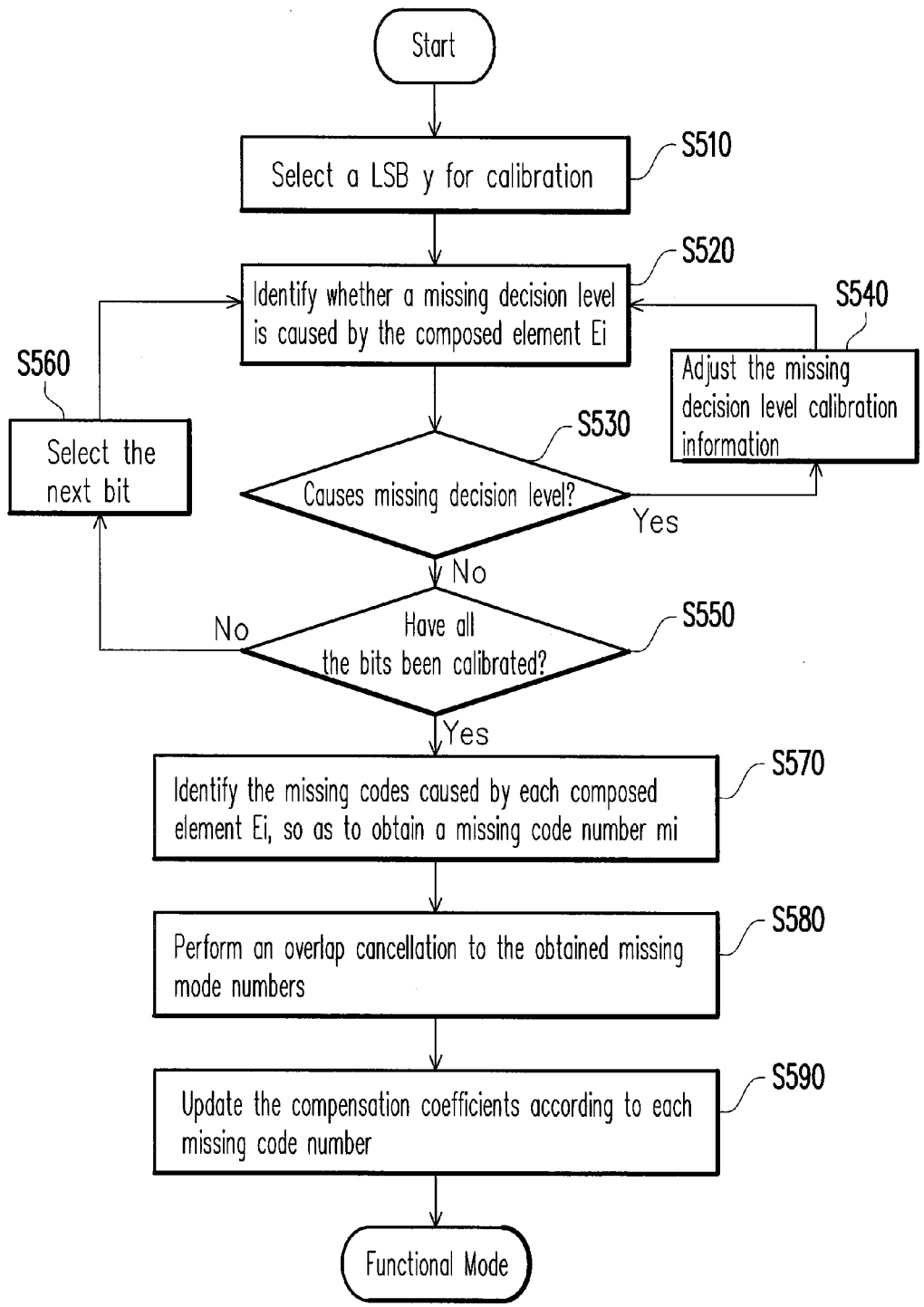
FIG. 5 is a flow chart of a method of linearity calibration according to an exemplary embodiment.

FIG. 5 is a flow chart of a method of linearity calibration according to an exemplary embodiment. Please refer to FIGS. 2, 3, and 5. The method of linearity calibration may be applied in the SAR ADC depicted in FIG. 2. In a Step S510, a less significant bit (LSB) y is selected for calibration in order to calibrate the composed elements $E_y, E_{y+1}, E_{N-1}$, in which y is a positive integer greater than or equal to 0 and less than N. Not all of the composed elements require calibration. According to actual conditions, a part of the more significant bits of the composed elements with a larger influence may be selected from all the composed elements. When calibrating in practice, the calibration is performed from the LSB to the most significant bit (MSB). In terms of steps, the following steps are repeated, starting from i equals to y, increasing successively by 1, until all of the composed elements for calibration have been calibrated.

In a Step S520, whether a missing decision level is caused by the composed element $E_i$ is identified. Step S520 may be divided into the following steps. During a first mode, for example the sampling mode, the first value $V_1$ is inputted for the composed elements $E_0, E_1, \ldots, E_{N-1}$ labeled less than i and the reference element E and the second value $V_0$ is inputted for the composed elements $E_i, E_{i+1}, \ldots, E_{N-1}$ labeled greater than or equal to i. During a second mode, for example a charge redistribution mode, the first value $V_1$ is inputted for the composed element $E_i$, and the second value $V_0$ is inputted for the other composed elements $E_0, \ldots, E_{i-1}, E_{i+1}, \ldots, E_{N-1}$ and the reference element $E_r$. Moreover, according to the output of the comparator 23 during the afore-described first mode or the second mode, for example during the charge redistribution mode, whether a missing decision level would occur is determined.

Figure 6A:
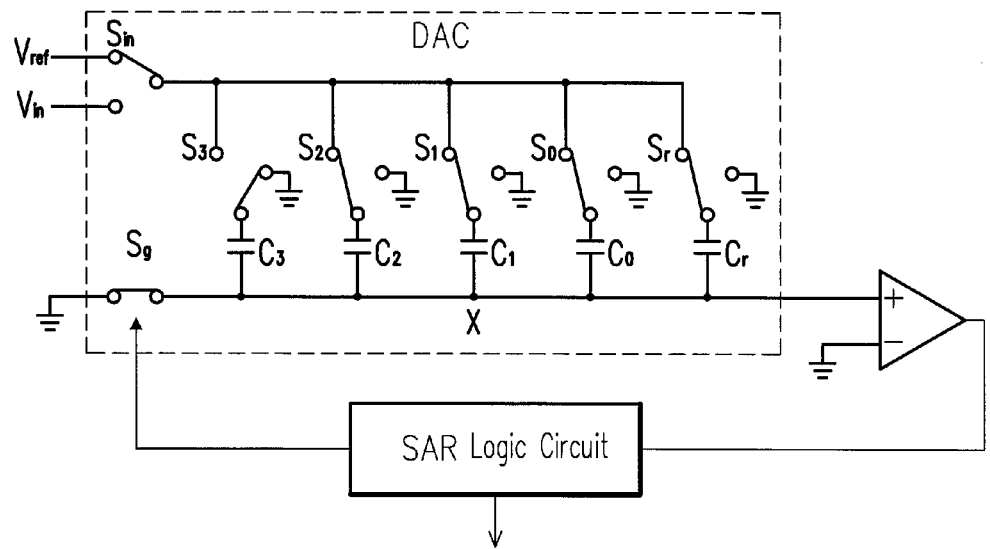
FIG. 6A is a partial circuit diagram of a 4-bit SAR ADC during a sampling mode.
Figure 6B:
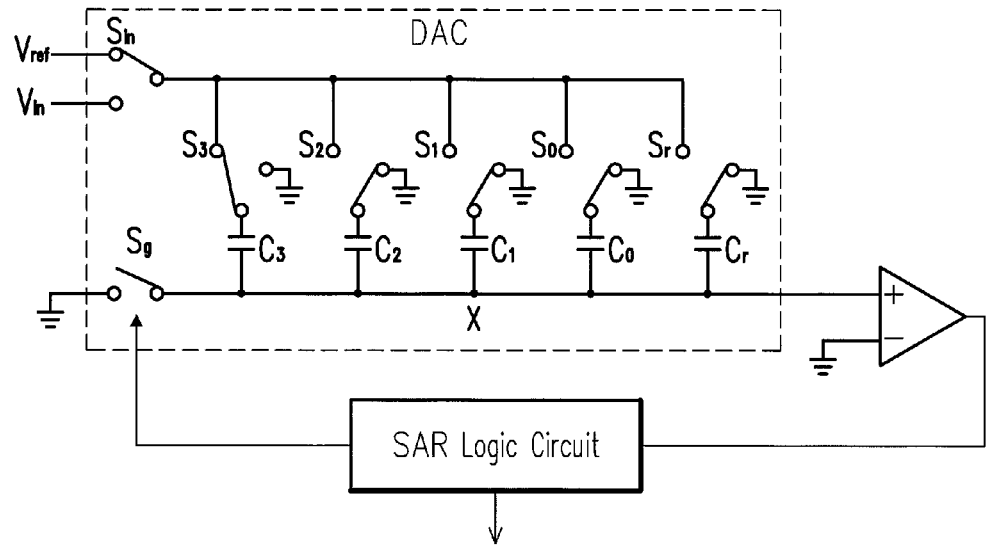
FIG. 6B is a partial circuit diagram of a 4-bit SAR ADC during a charge redistribution mode.

In order to illustrate the detailed steps within the Step S520, a 4-bit SAR ADC is used as an example to elaborate on how to identify whether the missing decision level is caused by the composed capacitor $C_3$. FIG. 6A is a partial circuit diagram of a 4-bit SAR ADC during a sampling mode, and FIG. 6B is a partial circuit diagram of a 4-bit SAR ADC during a charge redistribution mode. Please refer to FIGS. 6A and 6B. During the sampling mode, the switch $S_{in}$ is switched to conduct to the reference voltage $V_{ref}$, the switch $S_g$ is conducted, and the switch $S_3$ is switched to conduct to the ground voltage level so the capacitor $C_3$ has 0 voltage. The switches $S_0, S_1, S_2$, and $S_r$ are switched to conduct to the switch $S_{in}$ so the capacitors $C_0$, $C_1$, C2, and $C_r$ are charged to the reference voltage $V_{ref}$. In other words, the reference voltage $V_{ref}$ is inputted for the capacitors $C_0, C_1$, and $C_2$ labeled less than i and the reference element $C_r$, and 0 is inputted for the capacitor $C_3$ labeled greater than or equal to i. Thereafter, the switch $S_g$ is broken off and non-conductive, and the switches $S_0, S_1, S_2, S_3$, and $S_r$ are switched to conduct to the ground voltage level. During the charge redistribution mode, the switch $S_{in}$ is maintained to conduct to the reference voltage $V_{ref}$, the switch $S_g$ is broken off, and the switch $S_3$ is switched to conduct to the switch $S_{in}$. The switches $S_0, S_1, S_2$, and $S_r$ are switched to conduct to the ground voltage level. In other words, the reference voltage $V_{ref}$ is inputted for the capacitor $C_3$, and 0 is inputted for the other capacitors $C_0, C_1, C_2$, and the reference element $C_r$. The voltage at the node X at this time may be described by the following formula:

$$V_X = \frac{C_i - \left(\sum_{j=0}^{i-1} C_j + C_r\right)}{C_{total}} V_{ref}, \quad (3)$$

in which i=3, therefore when $V_x$ is greater than 0, the afore-described formula (I) is satisfied, and this represents the composed capacitor $C_3$ would cause the missing decision level. Therefore, the output of the comparator 23 can determine whether the missing decision level would occur. Similarly, in another embodiment, the switching operation of the switches during the sampling mode and the charge redistribution mode may be reversed. In other words, the missing decision level occurs when $V_x$ is less than 0, and thus the output of the comparator 23 can still determine whether the missing decision level would occur.

Continuing to a Step S530, when the missing decision level has been identified to be caused by the composed element $E_i$, a Step S540 is executed to adjust the missing decision level calibration information, so as to make the sub constructed elements $E_i^1, E_i^2, \ldots, E_i^{w_i}$ non-functional. An example of the Step S540 may be first letting z=1, in which z is a positive integer greater than or equal to 1 and less than or equal to $w_i$. The missing decision level calibration information is adjusted and stored in the weighting adjustment register 25. According to the missing decision level calibration information, the SAR ADC switches the switch $S_i^z$ in the DAC so the sub constructed element $E_i^z$ becomes nonfunctional. Thereafter, 1 is added to z, and the previous two steps are repeated, until no missing decision level would occur. When the missing decision level is not caused by the composed element $E_i$, a Step S550 is executed.

The Step S550 determines whether all the composed elements of every bit for calibration have been calibrated. If no, a Step S560 is executed to select the composed element of the next bit. For example, by adding 1 to i and storing back to i, then returning to the Step S520 to identify whether the missing decision level is caused by the new composed element $E_i$. When all of the composed elements for calibration have been calibrated, Step 570 is executed.

The Step 570 identifies the missing codes caused by each composed element $E_i$ in a part of the composed elements, so as to obtain a missing code number $m_i$. The Step 570 is performed from the LSB to the MSB in turn, starting by letting i be the lowest bit $E_i$ to be identified, and successively adding 1, until the highest bit $E_i$ has been identified. In the present embodiment, the missing code identification is performed on all of the composed elements, although the disclosure is not limited thereto. A part of composed elements having a larger influence may be chosen for the missing code identification. The Step 570 is divided into the following steps. During a third mode, for example the sampling mode, the first value $V_i$ is inputted for the composed element and the second value $V_o$ is inputted for the other composed elements $E_0, \ldots, E_{i-1}, E_{i+1}, \ldots, E_{N-1}$ and the reference element $E_r$. During a fourth mode, for example a search mode, the second value $V_0$ is inputted for the composed elements $E_i, E_{i+1}, \ldots, E_{N-1}$ labeled greater than or equal to i. Moreover, by using successive approximation, the input values for the composed elements $E_0, E_1, \ldots, E_{i-1}$ labeled less than i are searched and selected as one of the first value $V_1$ and the second value $V_0$. According to the input values of the composed elements $E_0, E_1, \ldots, E_{i-1}$ obtained after the search, the missing code number $m_i$ is calculated and obtained.

Figure 7:
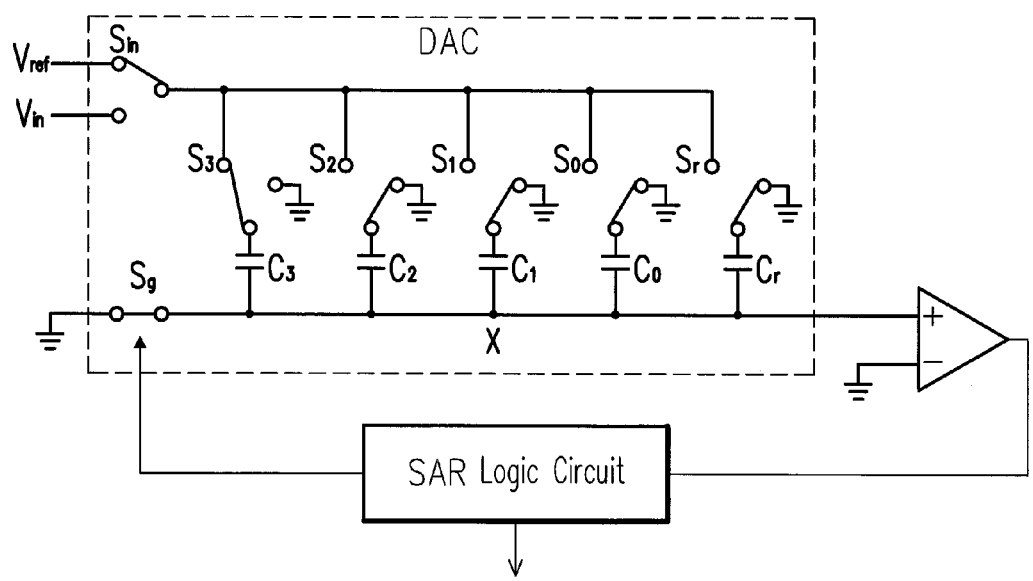
FIG. 7 is a partial circuit diagram of a 4-bit SAR ADC during a sampling mode.

In order to illustrate the detailed steps within the Step S570, a 4-bit SAR ADC is used as an example to elaborate on how to identify whether the missing code is caused by the composed capacitor $C_3$. FIG. 7 is a partial circuit diagram of a 4-bit SAR ADC during the sampling mode. Please refer to FIG. 7. During the sampling mode, the switch $S_{in}$ is switched to conduct to the reference voltage $V_{ref}$, the switch $S_g$ is conducted, and the switch $S_3$ is switched to conduct to the switch $S_{in}$ so the capacitor $C_3$ is charged to the reference voltage $V_{ref}$. The switches $S_0$, $S_1$, $S_2$, and $S_r$ are switched to conduct to the ground voltage level so the capacitors $C_0$, $C_1$, $C_2$, and $C_r$ have 0 voltage. In other words, the reference voltage $V_{ref}$ is inputted for the capacitor $C_3$ labeled equal to i, and 0 is inputted for the other capacitors $C_0$, $C_1$, $C_2$, and $C_r$. Thereafter, the switch $S_g$ is broken off and non-conductive, and the switches $S_0$, $S_1$, $S_2$, $S_3$, and $S_r$ are switched to conduct to the ground voltage level. During the search mode, the switch $S_{in}$ is maintained to conduct to the reference voltage $V_{ref}$, the switch $S_g$ is broken off, and 0 is inputted for the capacitor $C_3$ labeled greater than or equal to i. Moreover, by using successive approximation, the input values for the capacitors $C_0$, $C_1$, and $C_2$ labeled less than i are searched and selected as one of reference voltage $V_{ref}$ and 0, so as to satisfy the largest bit code $D_0, D_1, \ldots, D_{i-1}$ of the following formula:

$$C_i > \sum_{j=0}^{i-1} D_j \cdot C_j \tag{4}$$

According to the largest bit code $D_0, D_1, \ldots, D_{i-1}$ obtained after the search, the missing code number $m_i$ is calculated and obtained. The missing code number $m_i$ may be obtained by the following formula:

$$m_i = 2^i - C_{exist} - 1 \tag{5},$$

in which $C_{exist}$ is the numerical value formed by the largest bit code $D_0, D_1, D_{i-1}$.

The afore-described successive approximation is a binary search method, and may also be a unary search method, which is a search method starting from the largest/smallest value and monotonically searching down/up. However, the disclosure is not limited by the afore-described examples.

Figure 8A:
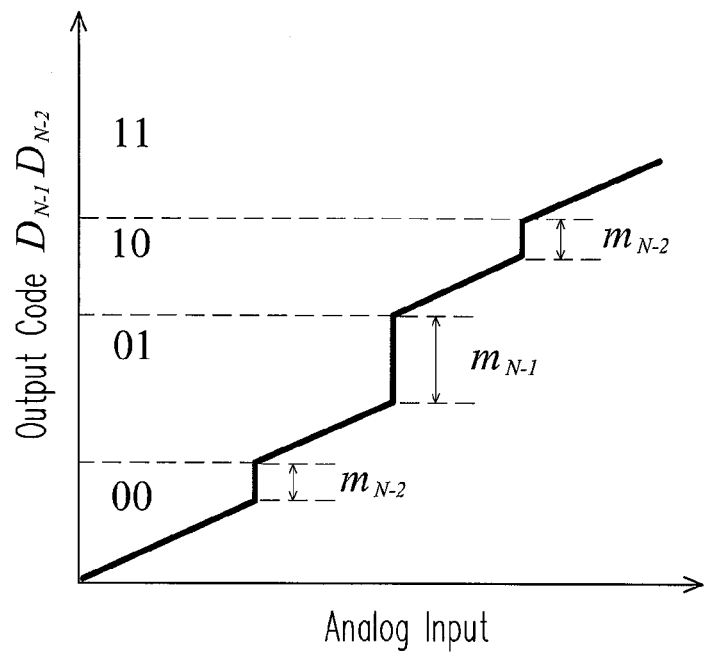
FIG. 8A is a partial conversion curve diagram of a SAR ADC having missing codes.
Figure 8B:
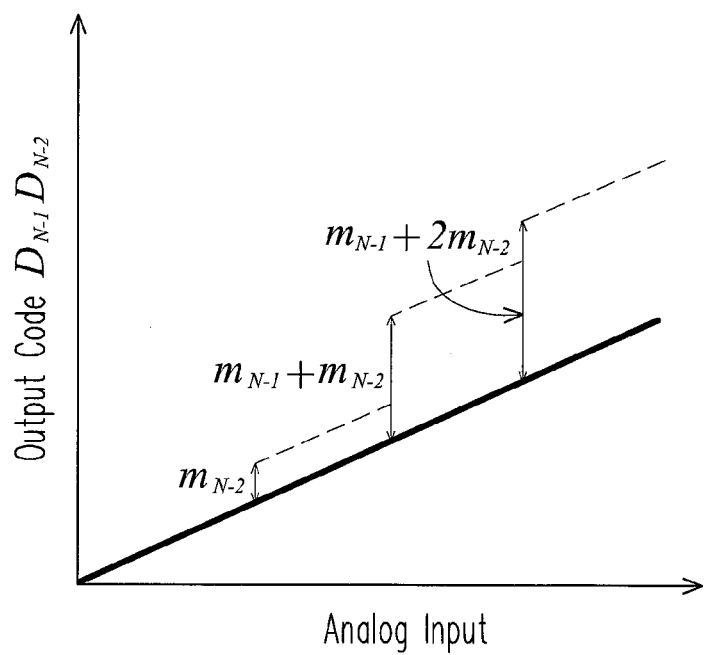
FIG. 8B is a partial conversion curve diagram of missing code compensation performed on FIG. 8A.

FIG. 8A is a partial conversion curve diagram of a SAR ADC having missing codes. FIG. 8B is a partial conversion curve diagram of missing code compensation performed on FIG. 8A. Please refer to FIGS. 8A and 8B. As shown in the figures, different missing code numbers $m_i$ are caused by composed elements $E_i$ of different bits. Therefore, when performing a linearity calibration to the output code, it is necessary to consider the frequency which the missing code numbers $m_i$ from the composed elements $E_i$ of different bits affect the calibration.

Figure 9:
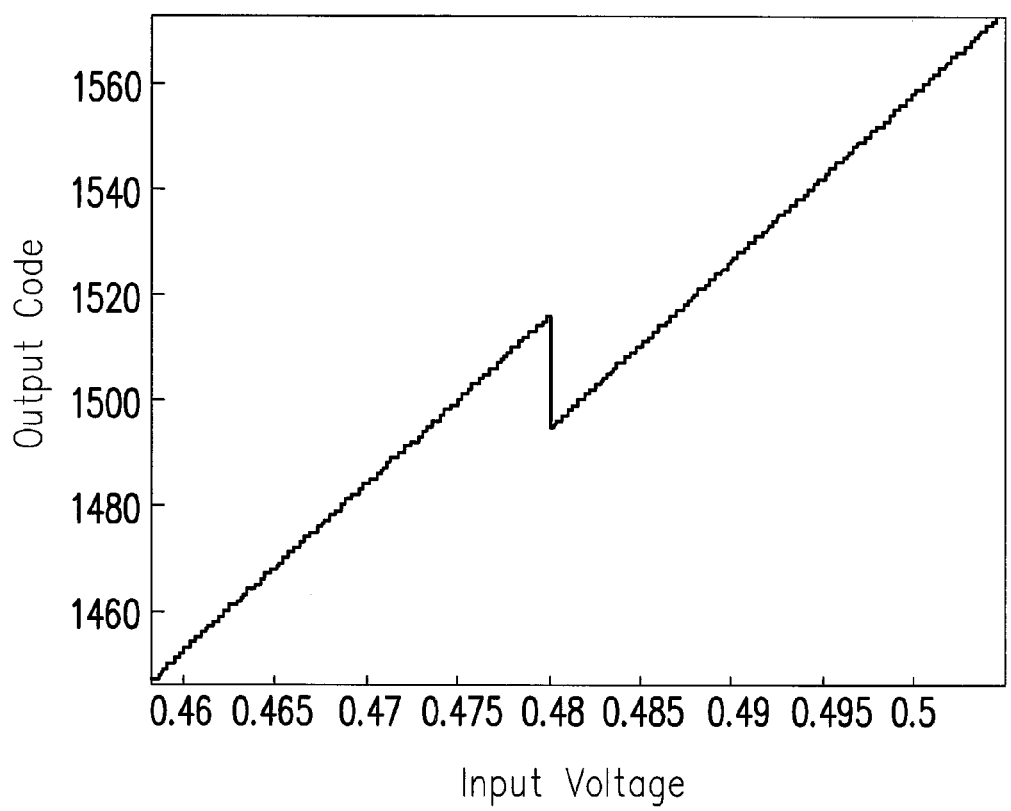
FIG. 9 is a partial conversion curve diagram of a SAR ADC with the missing code compensation performed without the overlap cancellation.

In a Step S580, an overlap cancellation to all of the obtained missing mode numbers is performed. FIG. 9 is a partial conversion curve diagram of a SAR ADC with the missing code compensation performed without the overlap cancellation. Please refer to FIG. 9. As shown in the figure, the overlap cancellation needs to be performed or else a linear conversion curve may not be obtained. This step is also performed from the LSB to the MSB in turn, starting by letting i be the lowest bit $E_i$, and successively adding 1, until the overlap cancellation is performed on all of the obtained missing code numbers. The Step S580 may be divided into the following steps. When i=0, a new missing code number $m_0' = m_0$, or the new missing code number $m_i'$ is obtained by calculating the following formula:

$$m_i' = m_i - \sum_{j=0}^{i-1} o_j \times m_j', \tag{6}$$

in which $o_j$ is a number of transition codes of bit j that fall in the same missing code segment of bit i, and j is a positive integer greater than or equal to 0 and less than i The transition codes of bit j may be represented by the following formula:

$$(2^j-1)+(k-1)\cdot 2^{j+1},$$

in which k is a positive integer greater than 0 and less than N−j.

In a Step S590, the compensation coefficients are updated according to all of the missing code numbers after the overlap cancellation. The compensation coefficients include each compensation coefficient $\epsilon_i$ of each composed element $E_i$. This step is similarly performed from the LSB to the MSB in turn, starting by letting i be the lowest bit $E_i$, and successively adding 1, until the compensation coefficients of all of the composed elements have been updated. The Step S590 may be divided into the following steps. When i=0, the compensation coefficient $\epsilon_i = 0$. When i=1, the compensation coefficient $\epsilon_i = m_i$. When $2 \leq i < N$, the compensation coefficient $c_i$ is obtained by calculating the following formula:

$$\varepsilon_i = m_i + \sum_{j=1}^{i-1} 2^{i-j-1} \times m_j, \tag{7}$$

in which j is a positive integer greater than or equal to 1 and less than i. This step may be arranged as:

$$\varepsilon_i = \begin{cases} m_i + \sum_{j=1}^{i-1} 2^{i-j-1} \cdot m_j, & \text{if } 2 \leq i < N \\ m_i, & \text{if } i = 1 \\ 0, & \text{if } i = 0 \end{cases} \tag{8}$$

When the SAR ADC enters a functional mode, the last compensation coefficient has already been stored in the compensation coefficient register 26. The compensation logic circuit 27 calculates an actual compensation code according to the compensation coefficients, and performs a compensation to the corresponding digital value outputted by the SAR logic circuit 24. The actual compensation code may be calculated by the following formula:

$$C_{cmp} = \epsilon_{N-1} D_{N-1} + \epsilon_{N-2} D_{N-2} + \ldots + \epsilon_0 D_0 \qquad (9),$$

in which the bit code $D_0, D_1, \ldots, D_{i-1}$ is the corresponding digital value outputted by the SAR logic circuit 24.

Figure 10:
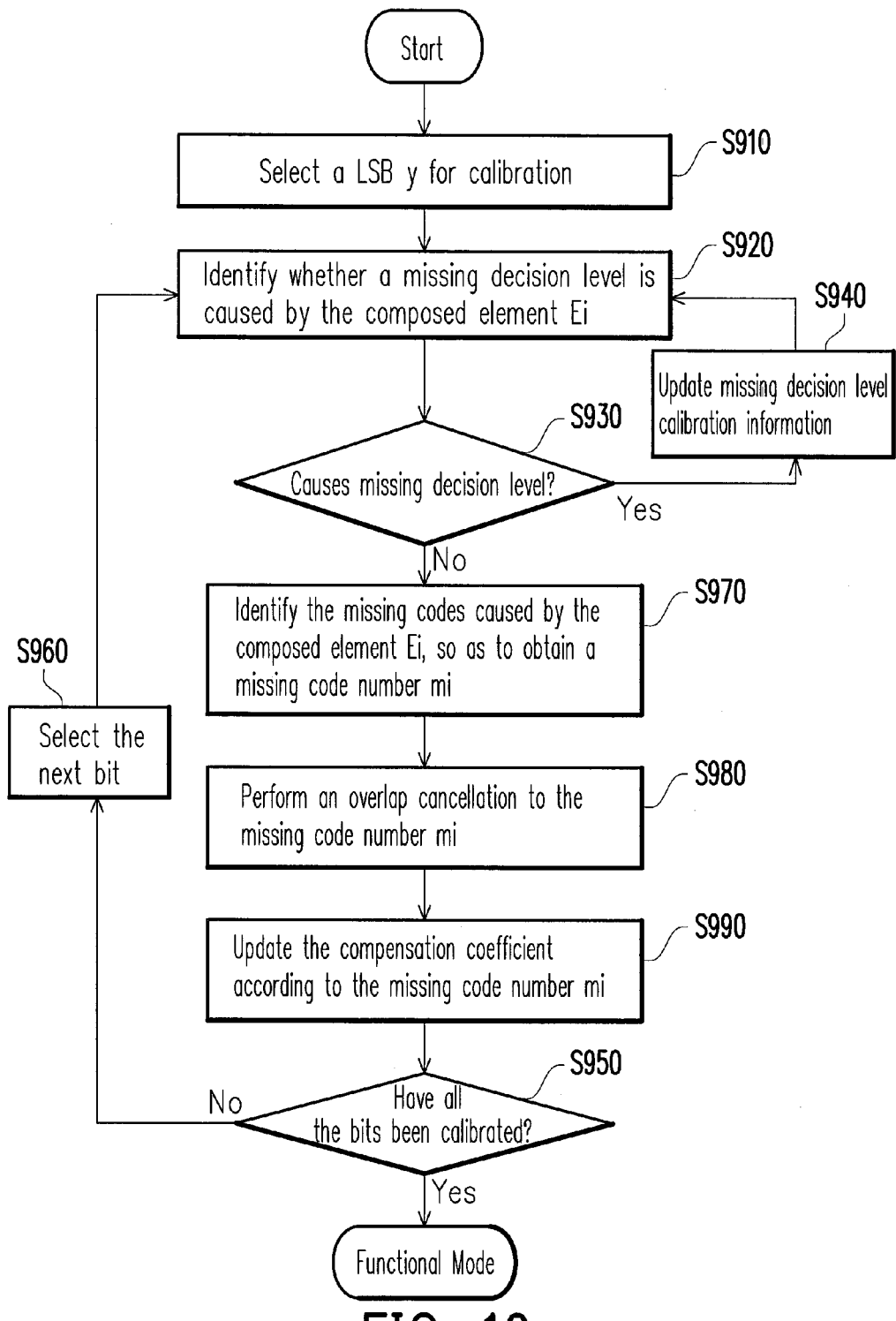
FIG. 10 is a flow chart of another method of linearity calibration according to an exemplary embodiment.

FIG. 10 is a flow chart of another method of linearity calibration according to an exemplary embodiment. Please refer to FIGS. 10 and 5. FIG. 5 clearly divides the entire linearity calibration method into two stages. The Steps S520, S530, and S540 are coordinated with Steps S550 and S560 to perform linearity calibration to the composed elements of all bits related to the missing decision level. Thereafter, the Steps S570, S580, and S590 are performed to update the compensation coefficients related to the missing code, but these three steps are separately computed on the composed elements of all bits for calibration. The Steps S920, S930, and S940 depicted in FIG. 10 are similar to the Steps S520, S530, and S540, therefore further description is omitted. However, the Steps S970, S980, and S990 are located within the loop of Steps S950 and S960. Moreover, in the Step S970, the missing codes caused by the composed element $E_i$ is identified, so as to obtain the missing code number $m_i$. In the Step 980, the overlap cancellation is performed on the missing code number $m_i$, and in the Step S990, the compensation coefficient is updated according to the missing code number $m_i$. These three steps are only targeted to a composed element $E_i$ of one bit. Therefore, FIG. 10 is not divided into two stages. The linearity calibration related to the missing decision level and the update to the compensation coefficients related to the missing codes are performed simultaneously. However, from the perspective of the composed element $E_i$ of each bit, the linearity calibration related to the missing decision level is performed first, and then the compensation coefficients related to the missing code are updated. Other computations and decisions within the Steps S970, S980, and S990 are similar to the Steps S570, S580, and S590, therefore further description is omitted.

In the foregoing embodiments, the linearity calibration of the missing decision level and the missing code are fully included, although the disclosure is not limited thereto. The linearity calibration may be performed by targeting only the missing decision level, or the linearity calibration may be performed by targeting only the missing code. For example, a SAR ADC which performs linearity calibration targeting only the missing decision level may include only: a DAC, a comparator, a SAR logic circuit, a weighting adjustment register, and a calibration logic circuit. On the other hand, a SAR ADC which performs linearity calibration targeting only the missing code may include only: a DAC, a comparator, a SAR logic circuit, a compensation coefficient register, a calibration logic circuit, and a compensation logic circuit. Similarly, a method of linearity calibration targeting only the missing decision level may include only: Steps S520, S530, S540, S550, and S560, or Steps S920, S930, S940, S950, and S960. On the other hand, a method of linearity calibration targeting only the missing code may include only: Steps S570, S580, and S590, or Steps S950, S960, S970, S980, and S990.

In view of the foregoing, according to the disclosure, each composed element $E_i$ in a part of the composed elements includes a main constructed element $E_i^0$ and $w_i$ sub constructed elements $E_i^1, E_i^2, \ldots, E_i^{w_i}$. A part of the sub constructed elements $E_i^1, E_i^2, \ldots, E_i^{w_i}$ is selected and made non-functional when the missing decision level is caused by the composed element $E_i$. From another perspective, an overlap cancellation to the obtained missing code numbers is performed in the disclosure. The compensation coefficients are updated according to the missing code numbers after the overlap cancellation, and a compensation to the corresponding digital value is performed according to the compensation coefficients. Accordingly, the disclosure might prevent the necessity of matching among the composed elements in the DAC, reduce the drive requirement of the driving circuit for the DAC, and further reduce the overall area and power consumption of the SAR ADC.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method of linearity calibration for a successive approximation register analog-to-digital converter (SAR ADC), the SAR ADC comprising a digital-to-analog converter (DAC), the DAC comprising a reference element $E_r$ and N composed elements $E_0, E_1, \ldots, E_{N-1}$, each composed element $E_i$ in a part of the composed elements comprises a main constructed element $E_i^0$ and $w_i$ sub constructed elements $E_i^1, E_i^2, \ldots, E_i^{w_i}$, wherein N is a positive integer greater than 1, $w_i$ is a positive integer greater than or equal to 1, i is a positive integer greater than or equal to 0 and less than N, the method comprising:

selecting a less significant bit (LSB) y for calibration in order to calibrate the composed elements $E_y, E_{y+1}, \ldots, E_{N-1}$, wherein y is a positive integer greater than or equal to 0 and less than N; and repeating the following steps starting from i equals to y, increasing i successively by 1, until all of the composed elements for calibration have been calibrated:

identifying whether a missing decision level is caused by the composed element and selecting a part of the sub constructed elements $E_i^1, E_i^2, \ldots, E_i^{w_i}$ and making them non-functional when the missing decision level is caused by the composed element $E_i$.

2. The method of linearity calibration as claimed in claim 1, wherein the step of identifying whether the missing decision level is caused by the composed element $E_i$ comprises:

during a first mode, inputting a first value $V_1$ for the composed elements $E_0, E_1, \ldots, E_{i-1}$ labeled less than i and the reference element $E_r$, and inputting a second value $V_0$ for the composed elements $E_i, E_{i+1}, E_{N-1}$ labeled greater than or equal to i;

during a second mode, inputting the first value $V_1$ for the composed element and inputting the second value $V_0$ for the other composed elements $E_0, \ldots, E_{i-1}, E_{i+1}, \ldots, E_{N-1}$ and the reference element $E_r$; and according to an output of the DAC during the first mode or the second mode, determining whether the missing decision level would occur.

3. The method of linearity calibration as claimed in claim 1, wherein the step of selecting a part of the sub constructed elements $E_i^1, E_i^2, \ldots, E_i^{w_i}$ and making them non-functional comprises:

letting z=1;
    making the sub constructed element $E_i^z$ non-functional;
    adding 1 to z;
    repeating the previous two steps, until the missing decision level would not occur, wherein z is a positive integer greater than or equal to 1 and less than or equal to $w_i$.

4. The method of linearity calibration as claimed in claim 1, further comprising:
   identifying the missing codes caused by the composed element $E_i$ to obtain a missing code number $m_i$;
   performing an overlap cancellation to the missing code number $m_i$; and
   updating a plurality of compensation coefficients according to the missing code number $m_i$,
   wherein the compensation coefficients comprise a compensation coefficient $\epsilon_i$ corresponding to the composed element $E_i$, and the SAR performs a compensation to a corresponding digital value outputted by a SAR logic circuit according to the compensation coefficients.

5. The method of linearity calibration as claimed in claim 4, wherein the step of identifying the missing code caused by the composed element $E_i$ to obtain the missing code number $m_i$ comprises:
   during a third mode, inputting a first value $V_1$ for the composed element $E_i$, and inputting a second value $V_0$ for the other composed elements $E_0, \ldots, E_{i-1}, E_{i+1}, \ldots, E_{N-1}$ and the reference element $E_r$;
   during a fourth mode, inputting the second value $V_0$ for the composed elements $E_i, E_{i+1}, \ldots, E_{N-1}$ labeled greater than or equal to i, and selecting the input values for the composed elements $E_0, E_1, \ldots, E_{i-1}$ labeled less than i as one of the first value $V_1$ the second value $V_0$; and
   according to the input values of the composed elements $E_0, E_1, \ldots, E_{i-1}$, calculating and obtaining the missing code number $m_i$.

6. The method of linearity calibration as claimed in claim 4, wherein the step of performing the overlap cancellation to the missing code number $m_i$ comprises:
   when i=0, a new missing code number $m_0' = m_0$; and
   the new missing code number $m_i'$ is obtained by calculating:

$$m_i' = m_i - \sum_{j=0}^{i-1} o_j \times m_j',$$

wherein $o_j$ is a number of transition codes of bit j that fall in a same missing code segment of bit i, and j is a positive integer greater than or equal to 0 and less than i.

7. The method of linearity calibration as claimed in claim 4, wherein the step of updating the compensation coefficients according to the missing code number $m_i$ comprises:
   when i=0, the compensation coefficient $\epsilon_i$=0;
   when i=1, the compensation coefficient $\epsilon_i = m_i$; and
   when $2 \leq i < N$, the compensation coefficient $\epsilon_i$ is obtained by calculating:

$$\varepsilon_i = m_i + \sum_{j=1}^{i-1} 2^{i-j-1} \times m_j,$$

wherein j is a positive integer greater than or equal to 1 and less than i.

8. The method of linearity calibration as claimed in claim 1, wherein the composed elements and the reference element are one of capacitors, resistors, and current sources.

9. A SAR ADC, comprising:
   a DAC, comprising:
      a reference element $E_r$; and
      N composed elements $E_0, E_1, \ldots, E_{N-1}$, each composed element $E_i$ in a part of the composed elements comprises:
         a main constructed element $E_i^0$; and
         $w_i$ sub constructed elements $E_i^1, E_i^2, \ldots, E_i^{w_i}$,
      wherein N is a positive integer greater than 1, $w_i$ is a positive integer greater than or equal to 1, i is a positive integer greater than or equal to 0 and less than N;
   a comparator having a first input terminal, a second input terminal, and an output terminal, adapted for comparing the inputs of the first input terminal and the second input terminal, and outputting a comparison result at the output terminal;
   a SAR logic circuit coupled to the comparator and the DAC, adapted for selecting one of a first value $V_1$ and a second value $V_0$ as the input values of all of the composed elements $E_0, E_1, \ldots, E_{i-1}$ according to an output of the comparator, so as to obtain a corresponding digital value of an input voltage;
   a weighting adjustment register coupled to the DAC, adapted for storing the missing decision level calibration information, and the SAR ADC makes a part of the sub constructed elements $E_i^1, E_i^2, \ldots, E_i^{w_i}$ non-functional according to the missing decision level calibration information; and
   a calibration logic circuit coupled to the SAR logic circuit and the weighting adjustment register, the calibration logic circuit controlling the SAR logic circuit to select one of the first value $V_1$ and the second value $V_0$ as the input values of all of the composed elements $E_0, E_1, \ldots, E_{N-1}$ and the reference element $E_r$, and according to the output of the comparator, the calibration logic circuit adjusting the missing decision level calibration information.

10. The SAR ADC as claimed in claim 9, wherein when performing a linearity calibration:
    selecting a LSB y for calibration in order to calibrate the composed elements $E_y, E_{y+1}, \ldots, E_{N-1}$, wherein y is a positive integer greater than or equal to 0 and less than N; and
    repeating the following steps starting from i equals to y, increasing i successively by 1, until all of the composed elements for calibration have been calibrated:
       identifying whether a missing decision level is caused by the composed element $E_i$, and adjusting the missing decision level calibration information when the missing decision level is caused by the composed element $E_i$, in order to select a part of the sub constructed elements $E_i^1, E_i^2, \ldots, E_i^{w_i}$ and making them non-functional.

11. The SAR ADC as claimed in claim 10, wherein when identifying whether the missing decision level is caused by the composed element $E_i$:
    during a first mode, inputting the first value $V_1$ for the composed elements $E_0, E_1, \ldots, E_{N-1}$ labeled less than i and the reference element $E_r$, and inputting the second value $V_0$ for the composed elements $E_i, E_{i+1}, \ldots, E_{N-1}$ labeled greater than or equal to i;
    during a second mode, inputting the first value $V_1$ for the composed element $E_i$, and inputting the second value $V_0$ for the other composed elements $E_0, \ldots, E_{i-1}, E_{i+1}, \ldots, E_{N-1}$ and the reference element $E_r$; and
    according to the output of the comparator during the first mode or the second mode, determining whether the missing decision level would occur.

12. The SAR ADC as claimed in claim 10, wherein each composed element $E_i$ in a part of the composed elements further comprises $w_i$ switches $S_i^1, S_i^2, \ldots, S_i^{w_i}$ coupled to the sub constructed elements $E_i^1, E_i^2, \ldots, E_i^{w_i}$, and when selecting a part of the sub constructed elements $E_i^1, E_i^2, \ldots, E_i^{w_i}$ and making them non-functional:

letting z=1;

switching the switch $S_i^z$ to make the sub constructed element $E_i^z$ non-functional;

adding 1 to z; and repeating the previous two steps, until the missing decision level would not occur, wherein z is a positive integer greater than or equal to 1 and less than or equal to $w_i$.

13. The SAR ADC as claimed in claim 9, further comprising:

a compensation coefficient register coupled to the calibration logic circuit, adapted for storing a plurality of compensation coefficients; and a compensation logic circuit coupled to the SAR logic circuit and the compensation coefficient register, adapted for performing a compensation to the corresponding digital value outputted by the SAR logic circuit according to the compensation coefficients, when the SAR ADC performs a linearity calibration:

selecting a LSB y for calibration in order to calibrate the composed elements $E_y, E_{y+1}, \ldots, E_{N-1}$, wherein y is a positive integer greater than or equal to 0 and less than N; and repeating the following steps starting from i equals to y, increasing i successively by 1, until all of the composed elements for calibration have been calibrated:

identifying the missing codes caused by the composed element $E_i$ to obtain a missing code number $m_i$;

performing an overlap cancellation to the missing code number $m_i$; and updating the compensation coefficients according to the missing code number $m_i$, wherein the compensation coefficients comprise a compensation coefficient $\epsilon_i$ corresponding to the composed element $E_i$.

14. The SAR ADC as claimed in claim 13, wherein when identifying the missing code caused by the composed element $E_i$ to obtain the missing code number $m_i$:

during a third mode, inputting the first value $V_1$ for the composed element $E_i$, and inputting the second value $V_0$ for the other composed elements $E_0, \ldots, E_{i-1}, E_{i+1}, \ldots, E_{N-1}$ and the reference element $E_r$;

during a fourth mode, inputting the second value $V_0$ for the composed elements $E_i, E_{i+1}, \ldots, E_{N-1}$ labeled greater than or equal to i, and selecting the input values for the composed elements $E_0, E_1, \ldots, E_{i-1}$ labeled less than i as one of the first value $V_1$ the second value $V_0$; and according to the input values of the composed elements $E_0, E_1, \ldots, E_{i-1}$, calculating and obtaining the missing code number $m_i$.

15. The SAR ADC as claimed in claim 13, wherein when performing the overlap cancellation to the missing code number $m_i$:

when i=0, a new missing code number $m_0' = m_0$; and the new missing code number $m_i'$ is obtained by calculating:

$$m_i' = m_i - \sum_{j=0}^{i-1} o_j \times m_j',$$

wherein $o_j$ is a number of transition codes of bit j that fall in a same missing code segment of bit i, and j is a positive integer greater than or equal to 0 and less than i.

16. The SAR ADC as claimed in claim 13, wherein when updating the compensation coefficients according to the missing code number $m_i$:

when i=0, the compensation coefficient $\epsilon_i=0$;

when i=1, the compensation coefficient $\epsilon_i=m_i$; and when $2 \leq i < N$, the compensation coefficient $\epsilon_i$ is obtained by calculating:

$$\varepsilon_i = m_i + \sum_{j=1}^{i-1} 2^{i-j-1} \times m_j,$$

wherein j is a positive integer greater than or equal to 1 and less than i.

17. The SAR ARC as claimed in claim 9, wherein the composed elements and the reference element are one of capacitors, resistors, and current sources.

18. A method of linearity calibration for a SAR ADC, the SAR ADC comprising a DAC, the DAC comprising a reference element $E_r$ and N composed elements $E_0, E_1, \ldots, E_{N-1}$, the method comprising:

identifying the missing codes caused by each composed element $E_i$ in a part of the composed elements to obtain a missing code number $m_i$;

performing an overlap cancellation to all of the obtained missing code numbers;

updating a plurality of compensation coefficients according to all of the missing code numbers after the overlap cancellation, the compensation coefficients comprising a compensation coefficient $c_i$ corresponding to each composed element $E_i$; and performing a compensation to a corresponding digital value outputted by a SAR logic circuit according to the compensation coefficients, wherein N is a positive integer greater than 1, and i is a positive integer greater than or equal to 0 and less than N.

19. The method of linearity calibration as claimed in claim 18, wherein the step of identifying the missing code caused by each composed element $E_i$ in a part of the composed elements to obtain the missing code number $m_i$ comprises:

during a third mode, inputting a first value $V_1$ for the composed element $E_i$, and inputting a second value $V_0$ for the other composed elements $E_0, \ldots, E_{i-1}, E_{i+1}, \ldots, E_{N-1}$ and the reference element $E_r$;

during a fourth mode, inputting the second value $V_0$ for the composed elements $E_i, E_{i+1}, \ldots, E_{N-1}$ labeled greater than or equal to i, and selecting the input values for the composed elements $E_0, E_1, \ldots, E_{i-1}$ labeled less than i as one of the first value $V_1$ the second value $V_0$; and according to the input values of the composed elements $E_0, E_1, \ldots, E_{i-1}$, calculating and obtaining the missing code number $m_i$.

20. The method of linearity calibration as claimed in claim 18, wherein the step of performing the overlap cancellation to all of the obtained missing code numbers comprises:

when i=0, a new missing code number $m_0' = m_0$; and
the new missing code number $m_i'$ is obtained by calculating:

$$m_i' = m_i - \sum_{j=0}^{i-1} o_j \times m_j',$$

wherein $o_j$ is a number of transition codes of bit j that fall in a same missing code segment of bit i, and j is a positive integer greater than or equal to 0 and less than i.

21. The method of linearity calibration as claimed in claim 18, wherein the step of updating the compensation coefficients according to all of the missing code numbers after the overlap cancellation comprises:
when i=0, the compensation coefficient $\epsilon_i = 0$;
when i=1, the compensation coefficient $\epsilon_i = m_i$; and
when $2 \leq i < N$, the compensation coefficient $\epsilon_i$ is obtained by calculating:

$$\epsilon_i = m_i + \sum_{j=1}^{i-1} 2^{i-j-1} \times m_j,$$

wherein j is a positive integer greater than or equal to 1 and less than i.

22. The method of linearity calibration as claimed in claim 18, wherein each composed element $E_i$ in a part of the composed elements comprises a main constructed element $E_i^0$ and $w_i$ sub constructed elements $E_i^1, E_i^2, \ldots, E_i^{w_i}$, wherein $w_i$ is a positive integer greater than or equal to 1, the method further comprising:
selecting a LSB y for calibration in order to calibrate the composed elements $E_y, E_{y+1}, \ldots, E_{N-1}$, wherein y is a positive integer greater than or equal to 0 and less than N; and
repeating the following steps starting from i equals to y, increasing i successively by 1, until all of the composed elements for calibration have been calibrated:
identifying whether a missing decision level is caused by the composed element $E_i$, and selecting a part of the sub constructed elements $E_i^1, E_i^2, \ldots, E_i^{w_i}$ and making them non-functional when the missing decision level is caused by the composed element $E_i$.

23. The method of linearity calibration as claimed in claim 22, wherein the step of identifying whether the missing decision level is caused by the composed element $E_i$ comprises:
during a first mode, inputting a first value $V_1$ for the composed elements $E_0, E_1, \ldots, E_{N-1}$ labeled less than i and the reference element $E_r$, and inputting a second value $V_0$ for the composed elements $E_i, E_{i+1}, \ldots, E_{N-1}$ labeled greater than or equal to i;
during a second mode, inputting the first value $V_1$ for the composed element $E_i$, and inputting the second value $V_0$ for the other composed elements $E_0, \ldots, E_{i-1}$, $E_{i+1}, \ldots, E_{N-1}$ and the reference element $E_r$; and
according to an output of the DAC during the first mode or the second mode, determining whether the missing decision level would occur.

24. The method of linearity calibration as claimed in claim 22, wherein the step of selecting a part of the sub constructed elements $E_i^1, E_i^2, \ldots, E_i^{w_i}$ and making them non-functional comprises:
letting z=1;
making the sub constructed element $E_i^z$ non-functional;
adding 1 to z; and
repeating the previous two steps, until the missing decision level would not occur,
wherein z is a positive integer greater than or equal to 1 and less than or equal to $w_i$.

25. The method of linearity calibration as claimed in claim 18, wherein the composed elements and the reference element are one of capacitors, resistors, and current sources.

26. A SAR ADC, comprising:
a DAC, comprising:
a reference element $E_r$; and
N composed elements $E_0, E_1, \ldots, E_{N-1}$;
a comparator having a first input terminal, a second input terminal, and an output terminal, adapted for comparing the inputs of the first input terminal and the second input terminal, and outputting a comparison result at the output terminal;
a SAR logic circuit coupled to the comparator and the DAC, adapted for selecting one of a first value $V_1$ and a second value $V_0$ as the input values of all of the composed elements $E_0, E_1, \ldots, E_{i-1}$ according to an output of the comparator, so as to obtain a corresponding digital value of an input voltage;
a compensation coefficient register adapted for storing a plurality of compensation coefficients;
a calibration logic circuit coupled to the SAR logic circuit and the compensation coefficient register, the calibration logic circuit controlling the SAR logic circuit to select one of the first value $V_1$ and the second value $V_0$ as the input values of all of the composed elements $E_0, E_1, \ldots, E_{N-1}$ and the reference element $E_r$, and according to the output of the comparator, the calibration logic circuit adjusting the compensation coefficients; and
a compensation logic circuit coupled to the SAR logic circuit and the compensation coefficient register, adapted for performing a compensation to the corresponding digital value outputted by the SAR logic circuit according to the compensation coefficients;
when the SAR ARC performs a linearity calibration: identifying the missing codes caused by each composed element $E_i$ in a part of the composed elements to obtain a missing code number performing an overlap cancellation to all of the obtained missing code numbers and updating the compensation coefficients according to all of the missing code number $m_i$ after the overlap cancellation, the compensation coefficients comprising a compensation coefficient $\epsilon_i$ corresponding to each composed element $E_i$, wherein N is a positive integer greater than 1, i is a positive integer greater than or equal to 0 and less than N.

27. The SAR ADC as claimed in claim 26, wherein when identifying the missing code caused by each composed element $E_i$ in a part of the composed elements to obtain the missing code number $m_i$:
during a third mode, inputting the first value $V_1$ for the composed element and inputting a second value $V_0$ for the other composed elements $E_0, \ldots, E_{i-1}, E_{i+1}, \ldots, E_{N-1}$ and the reference element $E_r$;
during a fourth mode, inputting the second value $V_0$ for the composed elements $E_i, E_{i+1}, \ldots, E_{N-1}$ labeled greater than or equal to i, and selecting the input values for the composed elements $E_0, E_1, \ldots, E_{i-1}$ labeled less than i as one of the first value $V_1$ the second value $V_0$; and
according to the input values of the composed elements $E_0, E_1, \ldots, E_{i-1}$, calculating and obtaining the missing code number $m_i$.

28. The SAR ADC as claimed in claim 26, wherein when performing the overlap cancellation to all of the obtained missing code numbers:
when i=0, a new missing code number $m_0'=m_0$; and
the new missing code number $m_i'$ is obtained by calculating:

$$m_i' = m_i - \sum_{j=0}^{i-1} o_j \times m_j',$$

wherein $o_j$ is a number of transition codes of bit j that fall in a same missing code segment of bit i, and j is a positive integer greater than or equal to 0 and less than i.

29. The SAR ADC as claimed in claim 26, wherein when updating the compensation coefficients according to all of the missing code numbers after the overlap cancellation:
when i=0, the compensation coefficient $\epsilon_i=0$;
when i=1, the compensation coefficient $\epsilon_i=m_i$; and
when $2 \leq i < N$, the compensation coefficient $c_i$ is obtained by calculating:

$$\varepsilon_i = m_i + \sum_{j=1}^{i-1} 2^{i-j-1} \times m_j,$$

wherein j is a positive integer greater than or equal to 1 and less than i.

30. The SAR ADC as claimed in claim 26, wherein each composed element $E_i$ in a part of the composed elements comprises:
a main constructed element $E_i^0$; and
$w_i$ sub constructed elements $E_i^1, E_i^2, \ldots, E_i^{w_i}$,
wherein $w_i$ is a positive integer greater than or equal to 1, the SAR ADC further comprising:
a weighting adjustment register coupled to the DAC and the calibration logic circuit, adapted for storing the missing decision level calibration information, the SAR ADC making a part of the sub constructed elements $E_i^1, E_i^2, \ldots, E_i^{w_i}$ non-functional according to the missing decision level calibration information, the calibration logic circuit controlling the SAR logic circuit to select one of the first value $V_1$ and the second value $V_0$ as the input values of all of the composed elements $E_0, E_1, \ldots, E_{N-1}$ and the reference element $E_r$, and according to an output of the comparator, the calibration logic circuit adjusting the missing decision level calibration information.

31. The SAR ADC as claimed in claim 30, wherein when performing a linearity calibration:
selecting a LSB y for calibration in order to calibrate the composed elements $E_y, E_{y+1}, \ldots, E_{N-1}$, wherein y is a positive integer greater than or equal to 0 and less than N; and
repeating the following steps starting from i equals to y, increasing i successively by 1, until all of the composed elements for calibration have been calibrated:
identifying whether a missing decision level is caused by the composed element $E_i$, and adjusting the missing decision level calibration information when the missing decision level is caused by the composed element $E_i$, in order to select a part of the sub constructed elements $E_i^1, E_i^2, \ldots, E_i^{w_i}$ and making them non-functional.

32. The SAR ADC as claimed in claim 31, wherein when identifying whether the missing decision level is caused by the composed element $E_i$:
during a first mode, inputting the first value $V_1$ for the composed elements $E_0, E_1, \ldots, E_{N-1}$ labeled less than i and the reference element $E_r$, and inputting the second value $V_0$ for the composed elements $E_i, E_{i+1}, \ldots, E_{N-1}$ labeled greater than or equal to i;
during a second mode, inputting the first value $V_1$ for the composed element $E_i$, and inputting the second value $V_0$ for the other composed elements $E_0, \ldots, E_{i-1}, E_{i+1}, \ldots, E_{N-1}$ and the reference element $E_r$; and
according to an output of the comparator during the first mode or the second mode, the determining whether the missing decision level would occur.

33. The SAR ADC as claimed in claim 31, wherein each composed element $E_i$ in a part of the composed elements further comprises $w_i$ switches $S_i^1, S_i^2, \ldots, S_i^{w_i}$ coupled to the sub constructed elements $E_i^1, E_i^2, \ldots, E_i^{w_i}$ and when selecting a part of the sub constructed elements $E_i^1, E_i^2, \ldots, E_i^{w_i}$ and making them non-functional:
letting z=1;
switching the switch $S_i^z$ to make the sub constructed element $E_i^z$ non-functional;
adding 1 to z; and
repeating the previous two steps, until the missing decision level would not occur,
wherein z is a positive integer greater than or equal to 1 and less than or equal to $w_i$.

34. The SAR ARC as claimed in claim 26, wherein the composed elements and the reference element are one of capacitors, resistors, and current sources.

\* \* \* \* \*